(12) United States Patent
Yamamoto

(10) Patent No.: US 8,470,952 B2
(45) Date of Patent: Jun. 25, 2013

(54) COMPOSITION FOR THERMOSETTING SILICONE RESIN

(75) Inventor: Mizuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 226 days.

(21) Appl. No.: 12/975,902

(22) Filed: Dec. 22, 2010

(65) Prior Publication Data

US 2011/0160409 A1    Jun. 30, 2011

(30) Foreign Application Priority Data

Dec. 24, 2009   (JP) .................................. 2009-292766

(51) Int. Cl.
*C08G 77/04* (2006.01)

(52) U.S. Cl.
USPC .............................................. 528/34; 528/31

(58) Field of Classification Search
USPC ....................................... 528/34, 31
See application file for complete search history.

(56) References Cited

U.S. PATENT DOCUMENTS

| 5,270,425 A | 12/1993 | Vanwert et al. |
| 2008/0003370 A1 | 1/2008 | Sweet et al. |
| 2012/0056236 A1* | 3/2012 | Hamamoto et al. .......... 257/100 |

FOREIGN PATENT DOCUMENTS

| EP | 2196503 A1 | 6/2010 |
| JP | 6-118254 A | 4/1994 |
| JP | 2000-198930 A | 7/2000 |
| JP | 2004-186168 A | 7/2004 |
| JP | 2008-150437 A | 7/2008 |

OTHER PUBLICATIONS

Extended European Search Report issued on Jan. 28, 2011 in the corresponding European Patent Application No. 10196365.0.

* cited by examiner

*Primary Examiner* — Kuo-Liang Peng
(74) *Attorney, Agent, or Firm* — Sughrue Mion, PLLC

(57) ABSTRACT

The present invention relates to a composition for a thermosetting silicone resin, the composition including: (1) a dual-end silanol type silicone oil; (2) an alkenyl group-containing dialkoxyalkylsilane; (3) an organohydrogensiloxane; (4) a condensation catalyst; and (5) a hydrosilylation catalyst.

8 Claims, No Drawings

COMPOSITION FOR THERMOSETTING SILICONE RESIN

FIELD OF THE INVENTION

The present invention relates to a composition for a thermosetting silicone resin. More particularly, the invention relates to a composition for a thermosetting silicone resin, capable of forming a semi-cured state where encapsulation processing of an optical semiconductor element can be performed.

BACKGROUND OF THE INVENTION

In high-power white LED devices whose application to generic illumination has been studied, encapsulation materials having light resistance and heat resistance have been demanded. In recent years, so-called "addition curing type silicone" has been frequently used.

This addition curing type silicone is obtained by thermal curing of a mixture mainly composed of a silicone derivative having vinyl groups on a main chain and a silicone derivative having SiH groups on a main chain in the presence of a platinum catalyst. For example, Patent Document 1 discloses a resin composition which provides a cured material having excellent transparency and insulating characteristics by introducing an organopolysiloxane into a composition to set the molar ratio of silicon-bonded hydrogen atoms in the composition to alkenyl groups to a specific range.

Patent Document 2 discloses a resin composition containing a silicone resin having at least two silicon-bonded alkenyl groups in one molecule thereof and an organohydrogensilane and/or an organohydrogenpolysiloxane having at least two silicon-bonded hydrogen atoms in one molecule thereof.

Patent Document 3 discloses a composition which provides a cured material having an excellent strength by using a straight-chain polyorganohydrogensiloxane having silicon-bonded hydrogen atoms (Si—H groups) midway of a molecular chain and a straight-chain polyorganohydrogensiloxane having Si—H groups at both ends of a molecular chain in combination in specific amounts.

On the other hand, a highly active platinum catalyst is generally used in the addition curing type silicone resin. Accordingly, when a curing reaction once starts, it is extremely difficult to stop the reaction halfway. It is therefore difficult to form a semi-cured state (stage B). Consequently, in order to decrease the catalytic activity of the platinum catalyst, it has been known that addition of a phosphorus compound, a nitrogen compound, a sulfur compound or an acetylene as a reaction inhibitor is effective (for example, see Patent Document 4).

Patent Document 1 JP-A-2000-198930
Patent Document 2 JP-A-2004-186168
Patent Document 3 JP-A-2008-150437
Patent Document 4 JP-A-6-118254

SUMMARY OF THE INVENTION

However, although the conventional addition curing type silicone resins have excellent durability, they are composed of viscous liquid before the curing reaction, so that handling becomes complicated, and the viscosity varies depending on the surrounding environment in some cases. Thus, they remain unsatisfactory. Furthermore, the high viscosity thereof also makes handling thereof more difficult.

Moreover, compounds known as a reaction inhibitor exert an influence on durability of the resins, so that another method of reaction control is required.

An object of the invention is to provide a composition for a thermosetting silicone resin, which has excellent handling properties and excellent light resistance and heat resistance and can form a semi-cured state where encapsulation processing of an optical semiconductor element can be performed.

Accordingly, the present invention relates to the following items 1 to 6.

1. A composition for a thermosetting silicone resin, the composition including:
   (1) a dual-end silanol type silicone oil;
   (2) an alkenyl group-containing dialkoxyalkylsilane;
   (3) an organohydrogensiloxane;
   (4) a condensation catalyst; and
   (5) a hydrosilylation catalyst.

2. The composition according to item 1, in which the (1) dual-end silanol type silicone oil is a compound represented by the formula (I):

in which $R^1$ represents a monovalent hydrocarbon group and n is an integer of 1 or more, provided that all $R^1$ groups may be the same or different.

3. The composition according to item 1 or 2, in which the (2) alkenyl group-containing dialkoxyalkylsilane is a compound represented by the formula (II):

$$R^2\text{—Si}(OR^3)_2R^4 \qquad (II)$$

in which $R^2$ represents a straight-chain or branched alkenyl group, and $R^3$ and $R^4$ each represents a monovalent hydrocarbon group, provided that $R^3$ and $R^4$ may be the same or different and two $R^3$ groups may be the same or different.

4. The composition according to any one of items 1 to 3, in which the (3) organohydrogensiloxane is at least one selected from the group consisting of a compound represented by the formula (III):

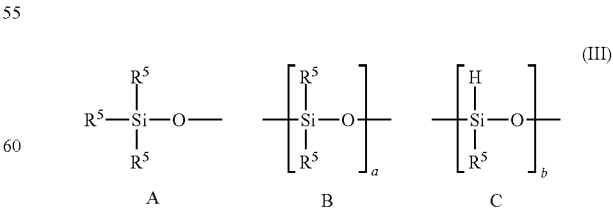

in which A, B and C are constitutional units, A represents a terminal unit, B and C each represents a repeating unit, $R^5$ represents a monovalent hydrocarbon group, a represents an integer of 0 or 1 or more, and b represents an integer of 2 or more, provided that all $R^5$ groups may be the same or different,
and a compound represented by the formula (IV):

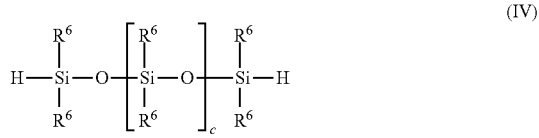

in which $R^6$ represents a monovalent hydrocarbon group and c represents an integer of 0 or 1 or more, provided that all $R^6$ groups may be the same or different.

5. The composition according to any one of items 1 to 4, further including (6) an alkenyl group-containing trialkoxysilane.

6. The composition according to item 5, in which the (6) alkenyl group-containing trialkoxysilane is a compound represented by the formula (V):

in which $R^7$ represents a straight-chain or branched alkenyl group and $R^8$ represents a monovalent hydrocarbon group, provided that three $R^8$ groups may be the same or different.

The composition for a thermosetting silicone resin of the invention achieves an excellent effect of being able to provide a silicone resin composition having excellent handling properties and excellent light resistance and heat resistance and being able to form a semi-cured state where encapsulation processing of an optical semiconductor element can be performed.

DETAILED DESCRIPTION OF THE INVENTION

The composition for a thermosetting silicone resin of the invention includes (1) a dual-end silanol type silicone oil, (2) an alkenyl group-containing dialkoxyalkylsilane, (3) an organohydrogensiloxane, (4) a condensation catalyst, and (5) a hydrosilylation catalyst. Since the composition contains components having condensation reactive functional groups and components having addition reactive functional groups, a completely cured resin can be prepared by first performing the condensation reaction to the components having condensation reactive functional groups thereby preparing a resin in a semi-cured state and then inducing an addition reaction.

A semi-cured state (hereinafter also referred to as stage B) of a general epoxy resin or the like is usually achieved by controlling thermosetting conditions. Specifically, for example, a crosslinking reaction of a monomer is allowed to partially proceed by heating at 80° C., thereby preparing pellets of stage B. Then, the resulting pellets are subjected to desired molding processing and then, heated at 150° C. to be completely cured. On the other hand, the addition curing type silicone resin is obtained by an addition reaction (hydrosilylation reaction) of a silicone derivative having vinyl groups on a main chain thereof and a silicone derivative having SiH groups on a main chain thereof, and a highly active platinum catalyst is generally used. Accordingly, when a curing reaction once starts, it is extremely difficult to stop the reaction halfway and hence it is difficult to form stage B. It is also known to control the reaction with a reaction inhibitor. However, since the composition of the invention contains a compound capable of reacting the monomer relating to the condensation reaction and the monomer relating to the hydrosilylation reaction so as to perform the crosslinking reaction of the monomers by two kinds of reaction systems different in reaction temperature, i.e., a condensation reaction system and an addition reaction (hydrosilylation reaction) system, it is surmised that the pellets of stage B can be prepared by regulating the reaction temperature to control the crosslinking reaction. Incidentally, in this specification, the semi-cured material, that is to say, the material in the semi-cured state (stage B) means a material in a state between stage A where the material is soluble in a solvent and stage C where the material is completely cured, and in a state where curing or gelation somewhat proceeds, and the material is swelled but is not completely dissolved in a solvent, and is softened but is not melted by heating. The completely cured material means a material in a state where curing or gelation has completely proceeded.

The composition includes:
(1) the dual-end silanol type silicone oil,
(2) the alkenyl group-containing dialkoxyalkylsilane,
(3) the organohydrogensiloxane,
(4) the condensation catalyst, and
(5) the hydrosilylation catalyst.

(1) Dual-End Silanol Type Silicone Oil

The dual-end silanol type silicone oil in the invention is not particularly limited but, from the viewpoint of compatibility with individual components, is preferably a compound represented by the formula (I):

in which $R^1$ represents a monovalent hydrocarbon group and n is an integer of 1 or more, provided that all $R^1$ groups may be the same or different. In the invention, since the end silanol group of the dual-end silanol type silicone oil brings about a condensation reaction, the dual-end silanol type silicone oil is referred to as a condensation reaction monomer.

$R^1$ in the formula (I) represents a monovalent hydrocarbon group. The hydrocarbon groups include saturated or unsaturated, straight-chain, branched or cyclic hydrocarbon groups. From the viewpoints of ease of preparation and thermal stability, the carbon number of the hydrocarbon group is preferably from 1 to 20 carbon atoms, and more preferably from 1 to 10 carbon atoms. Specifically, there are exemplified a methyl group, an ethyl group, a propyl group, a butyl group, a pentyl group, a hexyl group, a phenyl group, a naphthyl group, a cyclohexyl group, a cyclopentyl group and the like. Above all, a methyl group is preferred from the viewpoints of transparency and light resistance. Incidentally, in the formula (I), all $R^1$ groups may be the same or different. However, it is preferred that all are methyl groups.

Although n in the formula (I) represents an integer of 1 or more, it is preferably an integer of 1 to 10,000, and more preferably an integer of 1 to 1,000, from the viewpoints of stability and handling properties.

Examples of such compounds represented by the formula (I) include a dual-end silanol type polydimethylsiloxane, a dual-end silanol type polymethylphenylsiloxane and a dual-end silanol type polydiphenylsiloxane. These may be used either alone or as a combination of two or more thereof. Of these, preferred is a compound in which all $R^1$ groups are methyl groups and n is an integer of 1 to 1,000.

The compound represented by the formula (I) may be a commercially available product or a product synthesized according to a known method.

With regard to the compound represented by the formula (I), from the viewpoint of stability and handling properties, the molecular weight thereof is preferably from 100 to 1,000,000, and more preferably from 100 to 100,000. Incidentally, in this specification, the molecular weight of the silicone derivative is measured by gel filtration chromatography (GPC).

The content of the compound represented by the formula (I) in the dual-end silanol type silicone oil is preferably 50% by weight or more, more preferably 80% by weight or more, and still more preferably substantially 100% by weight.

The content of the dual-end silanol type silicone oil is preferably from 1 to 99% by weight, more preferably from 50 to 99% by weight, and still more preferably from 80 to 99% by weight, in the composition.

(2) Alkenyl Group-Containing Dialkoxyalkylsilane

The alkenyl group-containing dialkoxyalkylsilane is not particularly limited but, from the viewpoint of compatibility with individual components, is preferably a compound represented by the formula (II):

$$R^2\text{—Si(OR}^3)_2R^4 \quad (II)$$

in which $R^2$ represents a straight-chain or branched alkenyl group and $R^3$ and $R^4$ each represents a monovalent hydrocarbon group, provided that $R^3$ and $R^4$ may be the same or different and two $R^3$ groups may be the same or different. In the invention, since the alkenyl group of the alkenyl group-containing dialkoxyalkylsilane brings about the hydrosilylation reaction and the alkoxy group brings about the condensation reaction to result in resinification, the alkenyl group-containing dialkoxyalkylsilane is a compound reactive with both of the components relating to the condensation reaction and the components relating to the hydrosilylation reaction. When the composition of the invention is cured, the monomer relating to the condensation reaction and the monomer relating to the hydrosilylation reaction are combined with each other through the alkenyl group-containing dialkoxyalkylsilane. Moreover, since two alkoxy groups relating to the condensation reaction are present in one molecule, a molecular chain is prone to grow linearly and crosslinking becomes difficult, it is considered that an effect of achieving a low viscosity is obtained.

$R^2$ in the formula (II) represents a straight-chain or branched alkenyl group, and is an organic group containing an alkenyl group in a skeleton thereof. The carbon number of the organic group is preferably from 1 to 20, and more preferably from 1 to 10, from the viewpoint of ease of preparation and thermal stability. Specifically, there are exemplified a vinyl group, an allyl group, a propenyl group, a butenyl group, a pentenyl group, a hexenyl group, a heptenyl group, an octenyl group, a norbornenyl group, a cyclohexenyl group and the like. Above all, a vinyl group is preferred from the viewpoint of reactivity to the hydrosilylation reaction.

$R^3$ in the formula (II) represents a monovalent hydrocarbon group, i.e., an alkyl group, and $OR^3$ represents an alkoxy group. The carbon number of the hydrocarbon group is preferably from 1 to 10, and more preferably from 1 to 6, from the viewpoint of reactivity. Specifically, there are exemplified a methyl group, an ethyl group, a propyl group, a butyl group, a pentyl group, a hexyl group and the like. Above all, a methyl group is preferred from the viewpoint of reactivity to the condensation reaction. Incidentally, in the formula (II), two $R^3$ groups may be the same or different. However, it is preferred that all are methyl groups.

$R^4$ in the formula (II) represents a monovalent hydrocarbon group, i.e., an alkyl group. The carbon number of the hydrocarbon group is preferably from 1 to 10, and more preferably from 1 to 6, from the viewpoint of ease of preparation. Specifically, there are exemplified a methyl group, an ethyl group, a propyl group, a butyl group, a pentyl group, a hexyl group and the like. Above all, a methyl group is preferred from the viewpoint of availability from the market. Incidentally, in the formula (II), $R^3$ and $R^4$ may be the same or different. However, it is preferred that all are methyl groups.

Examples of such compounds represented by the formula (II) include vinyldimethoxymethylsilane, vinyldiethoxyethylsilane, allyldimethoxymethylsilane, propenyldimethoxymethylsilane, norbornenyldimethoxysilane and octenyldimethoxymethylsilane. These can be used either alone or as a combination of two or more thereof. Of these, preferred is vinyldimethoxymethylsilane in which $R^2$ is a vinyl group, all $R^3$ groups are methoxy groups and $R^4$ is a methyl group.

The compound represented by the formula (II) may be a commercially available product or a product synthesized according to a known method.

The content of the compound represented by the formula (II) in the alkenyl group-containing dialkoxyalkylsilane is preferably 50% by weight or more, more preferably 80% by weight or more and still more preferably substantially 100% by weight.

The content of the alkenyl group-containing dialkoxyalkylsilane is preferably from 0.01 to 90% by weight, and more preferably from 0.01 to 50% by weight and further preferably from 0.01 to 10% by weight.

Furthermore, the weight ratio of the dual-end silanol type silicone oil and the alkenyl group-containing dialkoxyalkylsilane is as follows. That is to say, from the viewpoint of allowing SiOH groups of the dual-end silanol type silicone oil and $SiOR^3$ groups of the alkenyl group-containing dialkoxyalkylsilane to react with each other in just proportion, the molar ratio ($SiOH/SiOR^3$) of the above-mentioned functional groups is preferably from 20/1 to 0.2/1, more preferably from 10/1 to 0.5/1, and still more preferably substantially equivalent (1/1). When the above-mentioned molar ratio is 20/1 or less, a semi-cured product having moderate toughness is obtained when the composition of the invention is semi-cured. On the other hand, when it is 0.2/1 or more, the alkenyl group-containing dialkoxyalkylsilane does not become too much, resulting in good heat resistance of the resulting resin.

(3) Organohydrogensiloxane

There is no particular limitation on the organohydrogensiloxane in the invention. However, from the viewpoint of compatibility with individual components, at least one selected from the group consisting of the compound represented by the formula (III):

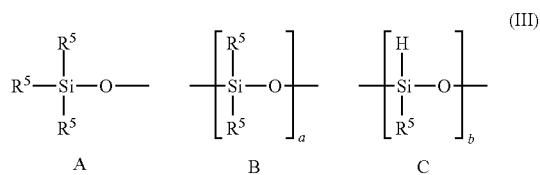

(III)

A                B                C in which A, B and C are constitutional units, A represents a terminal unit, B and C each represents a repeating unit, $R^5$ represents a monovalent hydrocarbon group, a represents an integer of 0 or 1 or more, and b represents an integer of 2 or more, provided that all $R^5$ groups may be the same or different, and a compound represented by the formula (IV):

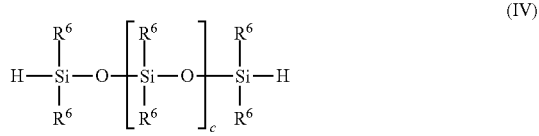

in which $R^6$ represents a monovalent hydrocarbon group and c represents an integer of 0 or 1 or more, provided that all $R^6$ groups may be the same or different,
is preferred. In the invention, the SiH groups of the organohydrogensiloxane bring about the hydrosilylation reaction, so that the organohydrogensiloxane is referred to as a monomer relating to the hydrosilylation reaction. Incidentally, in this specification, the organohydrogensiloxane means a generic term of all compounds including from low-molecular weight compounds to high-molecular weight compounds such as organohydrogendisiloxanes and organohydrogenpolysiloxanes.

The compound represented by the formula (III) is a compound constituted by the constitutional units A, B and C, in which A is the terminal unit, B and C are the repeating units, and hydrogen atoms are contained in the repeating units.

$R^5$ groups in the formula (III), that is to say, all of $R^5$ in the constitutional unit A, $R^5$ in the constitutional unit B and $R^5$ in the constitutional unit C represent a monovalent hydrocarbon group, and include saturated or unsaturated, straight-chain, branched or cyclic hydrocarbon groups. The carbon number of the hydrocarbon group is from 1 to 20 and preferably from 1 to 10, from the viewpoints of ease of preparation and thermal stability. Specifically, there are exemplified a methyl group, an ethyl group, a propyl group, a butyl group, a pentyl group, a hexyl group, a phenyl group, a naphthyl group, a cyclohexyl group, a cyclopentyl group and the like. Above all, a methyl group and an ethyl group are preferred from the viewpoint of transparency and light resistance. Incidentally, in the formula (III), all $R^5$ groups may be the same or different, and each independently represents the above-mentioned hydrocarbon group regardless of the constitutional unit.

The constitutional unit A is the terminal unit, and two units are contained in the formula (III).

The repeating unit number of the constitutional unit B, i.e., a in the formula (III), represents an integer of 0 or 1 or more. From the viewpoint of reactivity, it is preferably an integer of 1 to 1,000, and more preferably an integer of 1 to 100.

The repeating unit number of the constitutional unit C, i.e., b in the formula (III), represents an integer of 2 or more. From the viewpoint of reactivity, it is preferably an integer of 2 to 10,000, and more preferably an integer of 2 to 1,000.

Examples of such compounds represented by the formula (III) include a methylhydrogenpolysiloxane, a dimethylpolysiloxane-co-methylhydrogenpolysiloxane, an ethylhydrogenpolysiloxane and a methylhydrogenpolysiloxane-co-methylphenylpolysiloxane. These can be used either alone or as a combination of two or more thereof. Of theses, preferred are a compound in which $R^5$ is a methyl group, a is 0, and b is an integer of 2 or more, and a compound in which $R^5$ is an ethyl group, a is 0, and b is an integer of 2 or more.

The molecular weight of the compound represented by the formula (III) is preferably from 100 to 1,000,000, and more preferably from 100 to 100,000, from the viewpoints of stability and handling properties.

The compound represented by the formula (IV) is a compound having hydrogen atoms at both ends.

$R^6$ in the formula (IV) represents a monovalent hydrocarbon group, and examples thereof include saturated or unsaturated, straight-chain, branched or cyclic hydrocarbon groups. The carbon number of the hydrocarbon group is from 1 to 20, and preferably from 1 to 10, from the viewpoint of ease of preparation and thermal stability. Specifically, there are exemplified a methyl group, an ethyl group, a propyl group, a butyl group, a pentyl group, a hexyl group, a phenyl group, a naphthyl group, a cyclohexyl group, a cyclopentyl group and the like. Above all, a methyl group and an ethyl group are preferred from the viewpoint of transparency and light resistance. Incidentally, in the formula (IV), all $R^6$ groups may be the same or different. However, it is preferred that all are methyl groups or ethyl groups.

Although c in the formula (IV) represents an integer of 0 or 1 or more, it is preferably an integer of 1 to 10,000, and more preferably an integer of 1 to 1,000, from the viewpoint of reactivity.

Examples of such compounds represented by the formula (IV) include a dual-end hydrosilyl type polydimethylsiloxane, a dual-end hydrosilyl type polymethylphenylsiloxane and a dual-end hydrosilyl type polydiphenylsiloxane. These can be used either alone or as a combination of two or more thereof. Of these, preferred are a compound in which all $R^6$ groups are methyl groups and c is an integer of 1 to 1,000, and a compound in which all $R^6$ groups are ethyl groups and c is an integer of 1 to 1,000.

The molecular weight of the compound represented by the formula (V) is preferably from 100 to 1,000,000, and more preferably from 100 to 100,000, from the viewpoint of stability and handling properties.

As the compounds represented by the formulae (III) and (IV), a commercially available product may be used or a product synthesized according to a known method may be used.

The total content of the compounds represented by the formulae (III) and (IV) in the organohydrogensiloxane is preferably 50% by weight or more, more preferably 80% by weight or more and still more preferably substantially 100% by weight.

The content of the organohydrogensiloxane is preferably from 0.1 to 99% by weight, more preferably from 0.1 to 90% by weight and still more preferably from 0.1 to 80% by weight, in the composition.

Furthermore, the weight ratio of the alkenyl group-containing dialkoxyalkylsilane to the organohydrogensiloxane is as follows. That is to say, from the viewpoint of allowing $SiR^2$ groups of the alkenyl group-containing dialkoxyalkylsilane and SiH groups of the organohydrogensiloxane to react with each other in just proportion, the molar ratio ($SiR^2/SiH$) of the above-mentioned functional groups is preferably from 20/1 to 0.05/1, more preferably from 20/1 to 0.1/1, further preferably from 10/1 to 0.1/1, still more preferably from 10/1 to 0.2/1, and yet still more preferably from 5/1 to 0.2/1. When the above-mentioned molar ratio is 20/1 or less, moderate toughness is attained when the composition of the invention is semi-cured, whereas when it is 0.05/1 or more, the organohydrogensiloxane does not become too much, resulting in good heat resistance and toughness of the resulting resin. Moreover, the composition having the above-mentioned molar ratio of less than 1/1 to 0.05/1 or more exhibits a faster rate of curing the composition to a semi-cured state and thus can be cured within a shorter period of time as compared with the composition having the molar ratio of 20/1 to 1/1.

The weight ratio of the monomer relating to the condensation reaction to the monomer relating to the hydrosilylation reaction, i.e., the dual-end silanol type silicone oil to the organohydrogensiloxane (dual-end silanol type silicone oil/ organohydrogensiloxane), is preferably from 99.9/0.1 to 1/99.9, more preferably from 99.9/0.1 to 50/50, and still more preferably 99.9/0.1 to 90/10, from the viewpoint of viscoelasticity at the time of sheet formation.

(4) Condensation Catalyst

There is no particular limitation on the condensation catalyst in the invention, as long as it is a compound which catalyzes the condensation reaction of the silanol groups and alkoxysilyl groups. There are exemplified acids such as hydrochloric acid, acetic acid, formic acid and sulfuric acid; bases such as potassium hydroxide, sodium hydroxide, potassium carbonate and tetramethylammonium hydroxide; and metal catalysts such as aluminum, titanium, zinc and tin. Above all, tetramethylammonium hydroxide is preferred from the viewpoint of compatibility and thermal degradability. Although tetramethylammonium hydroxide in a solid state may be used as it is, it is preferably used as an aqueous solution or a methanol solution from the viewpoint of handling properties. It is more preferred to use a methanol solution from the viewpoint of transparency of the resin.

The content of the condensation catalyst in the composition is preferably from 0.1 to 50 mol, and more preferably from 1 to 5 mol, based on 100 mol of the dual-end silanol type silicone oil.

(5) Hydrosilylation Catalyst

There is no particular limitation on the hydrosilylation catalyst in the invention, as long as it is a compound which catalyzes the hydrosilylation reaction of the hydrosilane compound and the alkene. There are exemplified platinum catalysts such as platinum black, platinum chloride, chloroplatinic acid, a platinum-olefin complex, a platinum-carbonyl complex and platinum-acetyl acetate; palladium catalysts, rhodium catalysts and the like. Above all, a platinum-carbonyl complex is preferred from the viewpoint of compatibility, transparency and catalytic activity.

For example, when the platinum catalyst is used, the content of the hydrosilylation catalyst in the composition is preferably from $1.0 \times 10^{-4}$ to 1.0 part by weight, more preferably from $1.0 \times 10^{4}$ to 0.5 part by weight, and still more preferably from $1.0 \times 10^{-3}$ to 0.05 part by weight, based on 100 parts by weight of the organohydrogensiloxane, in terms of the amount of platinum.

Moreover, the composition for a thermosetting silicone resin preferably further contains (6) an alkenyl group-containing trialkoxysilane, in addition to the above-mentioned (1) to (5), for the viewpoint of viscosity adjustment.

(6) Alkenyl Group-Containing Trialkoxysilane

In the alkenyl group-containing trialkoxysilane, the alkenyl group brings about the hydrosilylation reaction and the alkoxy groups bring about the condensation reaction. Accordingly, the alkenyl group-containing trialkoxysilane is a compound reactive with both of the components relating to the condensation reaction and the components relating to the hydrosilylation reaction, similarly to the alkenyl group-containing dialkoxyalkylsilane. Therefore, in the case where the composition of the invention containing the above-mentioned (1) to (6) is cured, the monomer relating to the condensation reaction and the monomer relating to the hydrosilylation reaction are combined through both compounds of the alkenyl group-containing dialkoxyalkylsilane and the alkenyl group-containing trialkoxysilane. Since the number of the alkoxy groups in the alkenyl group-containing trialkoxysilane is 3 in one molecule, part of the alkoxy groups condenses to form a crosslinked structure and thus it is considered that an effect of increase in viscosity is obtained.

There is no particular limitation on the alkenyl group-containing trialkoxysilane in the invention. From the viewpoint of compatibility with individual components, a compound represented by the formula (V):

in which $R^7$ represents a straight-chain or branched alkenyl group, and $R^8$ represents a monovalent hydrocarbon group, provided that three $R^8$ groups may be the same or different, is preferred.

$R^7$ in the formula (V) represents a straight-chain or branched alkenyl group, and is an organic group containing an alkenyl group in a skeleton thereof. The carbon number of the organic group is preferably from 1 to 20, and more preferably from 1 to 10, from the viewpoint of ease of preparation and thermal stability, Specifically, there are exemplified a vinyl group, an allyl group, a propenyl group, a butenyl group, a pentenyl group, a hexenyl group, a heptenyl group, an octenyl group, a norbornenyl group, a cyclohexenyl group and the like. Above all, a vinyl group is preferred from the viewpoint of reactivity to the hydrosilylation reaction.

$R^8$ in the formula (V) is a monovalent hydrocarbon group, i.e., an alkyl group, and $OR^8$ represents an alkoxy group. The carbon number of the hydrocarbon group is preferably from 1 to 10, and more preferably from 1 to 6, from the viewpoint of reactivity. Specifically, there are exemplified a methyl group, an ethyl group, a propyl group, a butyl group, a pentyl group, a hexyl group and the like. Above all, a methyl group is preferred from the viewpoint of reactivity to the condensation reaction. Incidentally, in the formula (V), three $R^8$ groups may be the same or different. However, it is preferred that all are methyl groups.

Examples of such compounds represented by the formula (V) include vinyltrimethoxysilane, vinyltriethoxysilane, allyltrimethoxysilane, propenyltrimethoxysilane, norbornenyltrimethoxysilane and octenyltrimethoxysilane. These can be used either alone or as a combination of two or more thereof. Of these, preferred is vinyltrimethoxysilane in which $R^7$ is a vinyl group and all $R^8$ groups are methyl groups.

The compound represented by the formula (V) may be a commercially available product or a product synthesized according to a known method.

The content of the compound represented by the formula (V) in the alkenyl group-containing trialkoxysilane is preferably 50% by weight or more, more preferably 80% by weight or more and still more preferably substantially 100% by weight.

The content of the alkenyl group-containing trialkoxysilane is preferably from 0 to 90% by weight, more preferably from 0 to 50% by weight, and still more preferably from 0 to 10% by weight, in the composition.

Moreover, since both of the alkenyl group-containing dialkoxyalkylsilane and the alkenyl group-containing trialkoxysilane are compounds reactive to both of the components relating to the condensation reaction and the components relating to the hydrosilylation reaction, the weight ratio of them (alkenyl group-containing dialkoxyalkylsilane/alkenyl group-containing trialkoxysilane) is preferably from 100/0 to 10/90, more preferably from 100/0 to 20/80 and further preferably from 100/0 to 30/70 from the viewpoint of viscosity of the composition for a thermosetting silicone resin.

Furthermore, the weight ratio of the dual-end silanol type silicone oil to the alkenyl group-containing dialkoxyalkylsilane and the alkenyl group-containing trialkoxysilane is as follows. That is to say, from the viewpoint of allowing SiOH groups of the dual-end silanol type silicone oil and $SiOR^3$ groups of the alkenyl group-containing dialkoxyalkylsilane and SiOR$^8$ groups of the alkenyl group-containing trialkoxysilane to react with each other in just proportion, the molar ratio [SiOH/(SiOR$^3$+SiOR$^8$)] of the above-mentioned functional groups is preferably from 20/1 to 0.2/1, more preferably from 10/1 to 0.5/1, and still more preferably substantially equivalent (1/1). When the above-mentioned molar ratio is 20/1 or less, a semi-cured material having moderate toughness is obtained in the case where the composition of the invention is semi-cured, whereas when it is 0.2/1 or more, the alkenyl group-containing dialkoxyalkylsilane and the alkenyl group-containing trialkoxysilane do not become too much, resulting in good heat resistance of the resulting resin.

Moreover, the weight ratio of the alkenyl group-containing dialkoxyalkylsilane and the alkenyl group-containing trialkoxysilane to the organohydrogenpolysiloxane is as follows. That is to say, from the viewpoint of allowing SiR$^2$ groups of the alkenyl group-containing dialkoxyalkylsilane and SiR$^7$ groups of the alkenyl group-containing trialkoxysilane and SiH groups of the organohydrogensiloxane to react with each other in just proportion, the molar ratio [(SiR$^2$+SiR$^7$)/SiH] of the above-mentioned functional groups is preferably from 20/1 to 0.05/1, more preferably from 20/1 to 0.10/1, further preferably from 10/1 to 0.10/1, still more preferably from 10/1 to 0.20/1, and yet still more preferably from 5/1 to 0.2/1. When the above-mentioned molar ratio is 20/1 or less, moderate toughness is attained when the composition of the invention is semi-cured, whereas when it is 0.05/1 or more, the organohydrogensiloxane does not become too much, resulting in good heat resistance and toughness of the resulting resin. Moreover, the composition having the above-mentioned molar ratio of less than 1/1 to 0.05/1 or more exhibits a faster rate of curing the composition to a semi-cured state and thus can be cured within a shorter period of time as compared with the composition having the molar ratio of 20/1 to 1/1.

The composition for a thermosetting silicone resin of the invention may contain additives such as a fluorescent inorganic powder, a filler, an aging inhibitor, a modifying agent, a surfactant, a dye, a pigment, a discoloration preventing agent and an ultraviolet absorber, in addition to the above, within the range not impairing the effects of the invention.

The composition for a thermosetting silicone resin of the invention can be prepared without any particular limitation so long as the composition includes the respective components of the (1) dual-end silanol type silicone oil, the (2) alkenyl group-containing dialkoxyalkylsilane, the (3) organohydrogensiloxane, the (4) condensation catalyst, and the (5) hydrosilylation catalyst. However, from the viewpoint of appropriately selecting the reaction temperature and the reaction time depending on the respective reaction mechanisms of the condensation reaction and the hydrosilylation reaction to allow the reaction to proceed and to be completed, the components relating to the condensation reaction are previously mixed, and then, the components relating to the hydrosilylation reaction may be mixed.

The mixing of the components relating to the condensation reaction can be performed by stirring the (1) dual-end silanol type silicone oil, the (2) alkenyl group-containing dialkoxyalkylsilane, and the (4) condensation catalyst and an additive such as the organic solvent as needed preferably at 0 to 60° C. for 5 minutes to 24 hours. Incidentally, the alkenyl group-containing dialkoxyalkylsilane is a component relating to both the condensation reaction and the hydrosilylation reaction. However, it is preferred that the alkenyl group-containing dialkoxyalkylsilane is mixed concurrently with the (1) dual-end silanol type silicone oil, because the condensation reaction is started at a lower temperature than the hydrosilylation reaction. Moreover, in the case where the composition of the invention contains the (6) alkenyl group-containing trialkoxysilane, it is also preferred to mix the component at the time of mixing the components relating to the condensation reaction.

In the case where an organic solvent is used, there is no particular limitation on the kind thereof. However, 2-propanol is preferred from the viewpoint of enhancing compatibility of the silicone derivative and the condensation catalyst.

The existing amount of the organic solvent is preferably from 3 to 20 parts by weight, and more preferably from 5 to 10 parts by weight, based on 100 parts by weight of the total amount of the dual-end silanol type silicone oil, the alkenyl group-containing dialkoxyalkylsilane and the alkenyl group-containing trialkoxysilane. When the existing amount is 3 parts by weight or more, the reaction proceeds satisfactorily, whereas when it is 20 parts by weight or less, foaming of the composition in the curing step is reduced.

Incidentally, the condensation reaction of SiOH group of the dual-end silanol type silicone oil with the OR$^3$ group of the alkenyl group-containing dialkoxyalkylsilane and the OR$^8$ group of the alkenyl group-containing trialkoxysilane may be partially initiated by the above-mentioned mixing. The progress degree of the condensation reaction can be confirmed by the degree of disappearance of a peak derived from the alkoxy groups of the alkenyl group-containing dialkoxyalkylsilane and the alkenyl group-containing trialkoxysilane according to $^1$H-NMR measurement.

Then, as the components relating to the hydrosilylation reaction, the (3) organohydrogensiloxane and the (5) hydrosilylation catalyst are mixed with the above-mentioned mixture of the components relating to the condensation reaction. In the composition of the invention, when the cured material is obtained by conducting two kinds of reactions, i.e., the condensation reaction and the addition reaction, it is possible to prepare a molded product in the semi-cured state by conducting only the condensation reaction. Accordingly, there is no particular limitation on the mixing method, as long as the components relating to the hydrosilylation reaction are uniformly mixed with the mixture of the above-mentioned components relating to the condensation reaction.

The viscosity at 25° C. of the resulting composition for a thermosetting silicone resin is preferably from 10 to 100,000 mPa·s, and more preferably from 1,000 to 20,000 mPa·s. In this specification, the viscosity can be measured by using a B type viscometer.

The composition of the invention contains the silicone derivative having excellent heat resistance and light resistance as a main component, so that the composition can be suitably used as an encapsulation material for an optical semiconductor element. Accordingly, the invention provides an optical-semiconductor element encapsulation material containing the composition of the invention, and an optical semiconductor device in which the optical semiconductor element is encapsulated by using the encapsulation material.

Moreover, the composition for a thermosetting silicone resin of the invention can be formed into a sheet shape by applying the composition, for example, onto a release sheet (for example, a separator such as a polyester substrate) whose surface is release treated, to an appropriate thickness by a method such as casting, spin coating or roll coating, followed by drying by heating at such a temperature that the solvent is removable. The heating temperature cannot be completely determined depending on the kind of solvent used. However, according to the composition of the invention, in addition to the removal of the solvent, the condensation reaction is completed by this heating, thereby being able to prepare a silicone resin sheet in the semi-cured state (stage B). Accordingly, the invention also provides the silicone resin sheet obtained by semi-curing the composition for a thermosetting silicone resin of the invention. Incidentally, in this specification, "completion of the reaction" means the case where 80% or more of the functional groups associating with the reaction have reacted, and it can be confirmed by measuring the remaining alkoxy group content by the above-mentioned $^1$H-NMR.

The heating temperature is preferably from 40 to 120° C., and more preferably from 60 to 100° C. The heating time is not completely determined depending on the sheet thickness and the heating temperature but is preferably from 0.1 to 60 minutes, and more preferably from 0.1 to 15 minutes.

The thickness of the silicone resin sheet is not particularly limited but is, form the viewpoint of encapsulating properties, preferably 100 to 10,000 µm, and more preferably 100 to 3,000 µm.

For example, when an optical semiconductor device is prepared, in order to completely embed an optical semiconductor element mounted on a substrate and to perform encapsulation without deformation and damage of a bonding wire, the silicone resin sheet of the invention has a sheet hardness of preferably 99.9 to 80, more preferably 99.9 to 90, which is measured according to the method described in Examples to be described below.

Further, from the viewpoint of economic efficiency and handling properties, it is preferred that the silicone resin sheet of the invention can be stored at 25° C. for 24 hours or more as it is in the semi-cured state. The silicone resin sheet of the invention after storage at 25° C. for 24 hours desirably has a sheet hardness of preferably 80 to 120%, and more preferably 90 to 110%, further preferably 97 to 103%, when the sheet hardness before the storage is taken as 100%.

Since the silicone resin sheet of the invention is in the semi-cured state, for example, the resin sheet is laminated as such on an optical semiconductor element or on a known resin after potting, followed by performing encapsulation processing, and thereafter, the resin sheet is completely cured by heating at high temperature, thereby being able to prepare an optical semiconductor device. The complete curing of the resin sheet is performed by the reaction of the components relating to the hydrosilylation reaction. Accordingly, as another embodiment of the invention, there is provided a silicone resin cured material obtained by curing the silicone resin sheet of the invention.

There is no particular limitation on a method for laminating the sheet on the substrate and then performing encapsulation processing. For example, there is exemplified a method of pressing the sheet on the substrate by heating preferably at 100 to 200° C. and 0.01 to 10 MPa, more preferably at 120 to 160° C. and 0.1 to 1 MPa, for 5 to 600 seconds, using a laminator, and then performing encapsulation processing.

The heating temperature of the encapsulation processing is preferably from 120 to 250° C., and more preferably from 150 to 200° C. The heating time is preferably from 0.5 to 24 hours, and more preferably from 2 to 6 hours.

The progress degree of the hydrosilylation reaction can be confirmed by the degree of absorption of a peak derived from the SiH group of the organohydrogensiloxane, according to IR measurement. When the absorption intensity is less than 20% of an initial value (before the curing reaction), the hydrosilylation reaction is completed and the resin sheet is completely cured.

EXAMPLES

The invention will be described below with reference to examples, but is not construed as being limited thereto.

[Molecular Weight of Silicone Derivative]

The molecular weight is determined in terms of polystyrene by gel filtration chromatography (GPC).

[Viscosity of Composition]

The viscosity is measured by using a viscometer (B type viscometer) under conditions of 25° C. and 1 atm.

Example 1

A hundred grams (8.7 mmol) of a dual-end silanol type silicone oil (a compound in which all $R^1$ groups represent methyl groups, and n is 155, in the formula (I), average molecular weight: 11,500) and 1.15 g (8.7 mmol) of vinyldimethoxymethylsilane (a compound in which $R^2$ represents a vinyl group and all $R^3$ and $R^4$ groups represent methyl groups in the formula (II)) as an alkenyl group-containing dialkoxyalkylsilane (the molar ratio (SiOH/SiOR$^3$) of SiOH groups of the dual-end silanol type silicone oil to SiOR$^3$ groups of the alkenyl group-containing dialkoxyalkylsilane=1/1) were mixed by stirring, and then, 0.19 mL (0.17 mmol, 2.0 mol based on 100 mol of the dual-end silanol type silicone oil) of a methanol solution of tetramethylammonium hydroxide (concentration: 10% by weight) was added thereto as a condensation catalyst, followed by stirring at room temperature (25° C.) for 2 hours. Thereafter, in order to remove methanol in the reaction system, methanol removal by evaporation was performed under reduced pressure (67 Pa). To the resulting oil, 3.65 g of an organohydrogensiloxane (a compound in which all $R^5$ groups represent methyl groups, a=10, b=10, in the formula (III), viscosity: 20 mPa·s) (the molar ratio (SiR$^2$/SiH) of SiR$^2$ groups of the alkenyl group-containing dialkoxyalkylsilane to SiH groups of the organohydrogensiloxane=⅓) and 0.025 mL of a platinum carbonyl complex solution (platinum concentration: 2% by weight) as a hydrosilylation catalyst (the content of platinum was 0.014 part by weight based on 100 parts by weight of the organohydrogensiloxane) were added to obtain a composition for a silicone resin.

Example 2

A composition for a silicone resin was obtained in the same manner as in Example 1 except that the amount of the vinyldimethoxymethylsilane was changed from 1.15 g (8.7 mmol) to 1.035 g (7.83 mmol), the amount of the organohydrogensiloxane (a compound in which all $R^5$ groups represent methyl groups, a=10, b=10, in the formula (III)) was changed from 3.65 g to 3.53 g, and 0.086 g (0.58 mmol) of vinyltrimethoxysilane (a compound in which $R^7$ represents a vinyl group and all $R^8$ groups represent methyl groups in the formula (V)) as an alkenyl group-containing trialkoxysilane was added. The molar ratio [SiOH/(SiOR$^3$+SiOR$^8$)] was 1/1, the molar ratio [(SiR$^2$+SiR$^7$)/SiH] was 1/3.0, and the platinum content was 0.014 part by weight based on 100 parts by weight of the organohydrogensiloxane.

Example 3

A composition for a silicone resin was obtained in the same manner as in Example 1 except that the amount of the vinyldimethoxymethylsilane was changed from 1.15 g (8.7 mmol) to 0.575 g (4.35 mmol), the amount of the organohydrogensiloxane (a compound in which all $R^5$ groups represent methyl groups, a=10, b=10, in the formula (III)) was changed from 3.65 g to 3.045 g, and 0.43 g (2.9 mmol) of vinyltrimethoxysilane (a compound in which $R^7$ represents a vinyl group and all $R^8$ groups represent methyl groups in the formula (V)) as an alkenyl group-containing trialkoxysilane was added. The molar ratio [SiOH/(SiOR$^3$+SiOR$^8$)] was 1/1, the molar ratio [(SiR$^2$+SiR$^7$)/SiH] was 1/3.0, and the platinum content was 0.016 part by weight based on 100 parts by weight of the organohydrogensiloxane.

Example 4

A composition for a silicone resin was obtained in the same manner as in Example 1 except that the amount of the vinyldimethoxymethylsilane was changed from 1.15 g (8.7 mmol) to 0.288 g (2.18 mmol), the amount of the organohydrogensiloxane (a compound in which all R$^5$ groups represent methyl groups, a=10, b=10, in the formula (III)) was changed from 3.65 g to 2.74 g, and 0.645 g (4.35 mmol) of vinyltrimethoxysilane (a compound in which R$^7$ represents a vinyl group and all R$^8$ groups represent methyl groups in the formula (V)) as an alkenyl group-containing trialkoxysilane was added. The molar ratio [SiOH/(SiOR$^3$+SiOR$^8$)] was 1/1, the molar ratio [(SiR$^2$+SiR$^7$)/SiH] was 1/3.0, and the platinum content was 0.018 part by weight based on 100 parts by weight of the organohydrogensiloxane.

Using the compositions obtained, semi-cured products, completely cured products and optical semiconductor devices were prepared according to the following method. Incidentally, 10 g of liquid A and 10 g of liquid B of a commercially available two-liquid mixing type silicone elastomer (a heat-curing type high-viscosity product manufactured by Wacker Asahikasei Silicone Co., Ltd.) were thoroughly mixed to prepare a composition for a silicone resin, and a semi-cured product, a completely cured product and an optical semiconductor device were similarly prepared as in Reference Example 1.

Preparation Example 1 of Semi-Cured Material

Each of the compositions obtained was applied on a biaxially oriented polyester film (manufactured by Mitsubishi Chemical Polyester Film Co., Ltd., 50 μm) to a thickness of 500 μm. Then, the compositions of Examples 1 to 4 were heated at 135° C. for 5 minutes, and the composition of Reference Example 1 was allowed to stand at room temperature (25° C.) for 16 hours, thereby preparing sheet-like semi-cured products (sheets).

Preparation Example 1 of Completely Cured Material

For the sheets obtained above, the sheets of Examples 1 to 4 were heated at 150° C. for 4 hours, and the sheet of Reference Example 1 was heated at 150° C. for 1 hour, thereby preparing completely cured materials.

Preparation Example 1 of Optical Semiconductor Device

A substrate on which a blue LED was mounted was coated with each of the sheets in a semi-cured state obtained above, followed by heating under reduced pressure at 160° C. and performing encapsulation processing at a pressure of 0.2 MPa. The resulting device was heated at 150° C. for 1 hour, thereby completely curing the resin to prepare an optical semiconductor device.

For the semi-cured products, completely cured products and optical semiconductor devices obtained, characteristics were evaluated according to the following Test Examples 1 to 5. The results thereof are shown in Table 1.

Test Example 1

Storage Stability

When a load of 7 g/mm$^2$ was applied to the semi-cured product immediately after the preparation and after the storage at room temperature (25° C.) for 24 hours by a sensor head using a digital length measuring meter (MS-5C, manufactured by Nikon Corporation), the distance the sensor head sank from a surface of the semi-cured product was measured, and the sheet hardness was determined based on the following equation:

Sheet hardness=[1−(the distance(μm)the sensor head sank/the film thickness(μm)of the semi-cured product)]×100

Then, the ratio of the resulting sheet hardness [(after the storage/immediately after the preparation)×100] was taken as the hardness maintaining ratio(%), and storage stability was evaluated according to the following evaluation criteria:
[Evaluation Criteria of Storage Stability]
  A: the hardness maintaining ratio was more than 97% and less than 103%.
  B: the hardness maintaining ratio was from 80 to 97% or from 103 to 120%.
  C: the hardness maintaining ratio was less than 80% or more than 120%.

Test Example 2

Light Transmittance

The light transmittance (%) of each completely cured material at a wavelength of 450 nm was measured by using a spectrophotometer (U-4100, manufactured by Hitachi High-Technologies Corporation). The higher light transmittance shows the more excellent transparency.

Test Example 3

Heat Resistance

Each completely cured material was allowed to stand still in a hot air type dryer of 150° C., and the appearance (transparency) of the completely cured product after an elapse of 100 hours was visually observed. The case where no change in color from a state before storage was observed was evaluated as "A", and the case where a change in color was observed was evaluated as "B". Further, each completely cured product was allowed to stand still in a hot air type dryer of 200° C., and the weight thereof after an elapse of 24 hours divided by the weight thereof before storage was taken as the residual ratio (%). No change in appearance after storage and the higher residual ratio show the more excellent heat resistance.

Test Example 4

Encapsulation Property

States of each semiconductor device before and after encapsulation were observed under an optical microscope. The case where the semiconductor element was completely embedded and no deformation and damage of bonding wire were observed was evaluated as "A", and the case where deformation and damage were observed was evaluated as "B".

Test Example 5

Light Resistance

An electric current of 300 mA was applied to each optical semiconductor device to light an LED element, and the luminance thereof immediately after the test was started was measured with an instantaneous multiple photometric system (MCPD-3000, manufactured by Otsuka Electronics Co., Ltd.). Then, the LED element was allowed to stand in a state where it was lighted, and the luminance after an elapse of 300 hours was similarly measured. The luminance maintaining ratio was calculated by the following equation, and the light resistance was evaluated. The higher luminance maintaining ratio shows the more excellent heat resistance.

Luminance maintaining ratio(%)=(luminance after an elapse of 300 hours/luminance immediately after the start of test)

TABLE 1

| | | | Example 1 | Example 2 | Example 3 |
|---|---|---|---|---|---|
| Composition | (1) Dual-End Silanol Type Silicone Resin | | Compound in which all $R^1$ groups are methyl, n = 155, in the formula (I) | Compound in which all $R^1$ groups are methyl, n = 155, in the formula (I) | Compound in which all $R^1$ groups are methyl, n = 155, in the formula (I) |
| | (2) Alkenyl group-containing dialkoxyalkylsilane | | Vinyldimethoxymethylsilane | Vinyldimethoxymethylsilane | Vinyldimethoxymethylsilane |
| | (3) Organohydrogensiloxane | | Compound in which all $R^5$ groups are methyl, a = 10, b = 10, in the formula (III) | Compound in which all $R^5$ groups are methyl, a = 10, b = 10, in the formula (III) | Compound in which all $R^5$ groups are methyl, a = 10, b = 10, in the formula (III) |
| | (4) Condensation Catalyst | | Tetramethylammonium hydroxide | Tetramethylammonium hydroxide | Tetramethylammonium hydroxide |
| | (5) Hydrosilylation Catalyst | | Pt-TMDS complex | Pt-TMDS complex | Pt-TMDS complex |
| | (6) Alkenyl Group-containing trialkoxysilane | | — | Vinyltrimethoxysilane | Vinyltrimethoxysilane |
| | $(1)/(3)^{1)}$ | | 96.5/3.5 | 96.6/3.4 | 97.0/3.0 |
| | (2) Content[2)] | | 1.150 | 1.035 | 0.575 |
| | (6) Content[3)] | | — | 0.086 | 0.430 |
| | $(2)/(6)^{4)}$ | | — | 92.3/7.7 | 57.2/42.8 |
| | SiOH/(SiOR$^3$ + SiOR$^8$)[5)] | | 1/1 | 1/1 | 1/1 |
| | (SiR$^2$ + SiR$^7$)/SiH[6)] | | 1/3.0 | 1/3.0 | 1/3.0 |
| | Viscosity (mPa·s)(25° C.) | | 1300 | 1400 | 1800 |
| Semi-cured product | Storage Stability | Hardness Immediately after Preparation | 2.1 | 5.2 | 7.0 |
| | | Hardness after Storage | 2.1 | 5.3 | 7.1 |
| | | Hardness Maintaining Ratio (%) | A | A | A |
| Completely cured product | Light Transparency | Light Transmittance (%) | 99 | 99 | 99 |
| | Heat Resistance | Appearance | A | A | A |
| | | Residual Ratio (%) | 99 | 99 | 99 |
| Apparatus | Encapsulation Property | | A | A | A |
| | Light Resistance | Luminance Maintaining Ratio (%) | 99 | 99 | 99 |

| | | | Example 4 | Reference Example 1 |
|---|---|---|---|---|
| Composition | (1) Dual-End Silanol Type Silicone Resin | | Compound in which all $R^1$ groups are methyl, n = 155, in the formula (I) | — |
| | (2) Alkenyl group-containing dialkoxyalkylsilane | | Vinyldimethoxymethylsilane | — |
| | (3) Organohydrogensiloxane | | Compound in which all $R^5$ groups are methyl, a = 10, b = 10, in the formula (III) | — |
| | (4) Condensation Catalyst | | Tetramethylammonium hydroxide | — |
| | (5) Hydrosilylation Catalyst | | Pt-TMDS complex | — |
| | (6) Alkenyl Group-containing trialkoxysilane | | Vinyltrimethoxysilane | — |
| | $(1)/(3)^{1)}$ | | 97.3/2.7 | — |
| | (2) Content[2)] | | 0.288 | — |
| | (6) Content[3)] | | 0.645 | — |
| | $(2)/(6)^{4)}$ | | 30.9/69.1 | — |
| | SiOH/(SiOR$^3$ + SiOR$^8$)[5)] | | 1/1 | — |
| | (SiR$^2$ + SiR$^7$)/SiH[6)] | | 1/3.0 | — |
| | Viscosity (mPa·s)(25° C.) | | 2500 | 15000 |
| Semi-cured product | Storage Stability | Hardness Immediately after Preparation | 7.4 | 7.1 |
| | | Hardness after Storage | 7.6 | 19 |
| | | Hardness Maintaining Ratio (%) | A | C |
| Completely cured | Light Transparency | Light Transmittance (%) | 99 | 99 |

TABLE 1-continued

| | | | | |
|---|---|---|---|---|
| product | Heat Resistance | Appearance | A | A |
| | | Residual Ratio (%) | 99 | 91 |
| Apparatus | | Encapsulation Property | A | B |
| | Light Resistance | Luminance Maintaining Ratio (%) | 99 | 95 |

Note)
Pt-TMDS: platinum-1,3-divinyl-1,1,3,3-tetramethyldisiloxane complex
[1]It shows a weight ratio [(1)/(3)] of (1) dual-end silanol type silicone resin to (3) organohydrogensiloxane.
[2]It shows content (parts by weight) of (2) alkenyl group-containing dialkoxyalkylsilane to 100 parts by weight of (1) dual-end silanol type silicone resin.
[3]It shows content (parts by weight) of (6) alkenyl group-containing trialkoxysilane to 100 parts by weight of (1) dual-end silanol type silicone resin.
[4]It shows a weight ratio [(2)/(6)] of (2) alkenyl group-containing dialkoxyalkylsilane to (6) alkenyl group-containing trialkoxysilane
[5]It shows a ratio [SiOH/(SiOR³ + SiOR⁸)] of SiOH groups of (1) dual-end silanol type silicone resin to total amount of SiOR³ groups of (2) alkenyl group-containing dialkoxyalkylsilane and SiOR⁸ groups of (6) alkenyl group-containing trialkoxysilane.
[6]It shows a ratio [(SiR³ + SiR⁷)/SiH] of total amount of SiR³ groups of (2) alkenyl group-containing dialkoxyalkylsilane and SiR⁷ groups of (6) alkenyl group-containing trialkoxysilane to SiH groups of (3) organohydrogensiloxane.

As a result, it is found that the resin compositions of Examples are excellent encapsulation materials capable of forming a semi-cured state and excellent in all of light transparency, heat resistance and light resistance, compared to the composition of Reference Example 1.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2009-292766 filed on Dec. 24, 2009, and the contents are incorporated herein by reference.

All references cited herein are incorporated by reference herein in their entirety.

Also, all the references cited herein are incorporated as a whole.

The composition for a thermosetting silicone resin of the invention achieves an excellent effect of being able to provide a silicone resin composition having excellent handling properties and excellent light resistance and heat resistance and being able to form a semi-cured state where encapsulation processing of an optical semiconductor element can be performed.

The composition for a thermosetting silicone resin of the invention can be suitably used, for example, at the time of producing semiconductor elements of backlights of liquid crystal screens, traffic signals, outdoor large-sized displays, advertising signs and the like.

What is claimed is:

1. A composition for a thermosetting silicone resin, said composition comprising:
   (1) a dual-end silanol silicone oil in an amount of from 50 to 99% by weight;
   (2) an alkenyl group-containing dialkoxyalkylsilane in an amount of from 0.01 to 50% by weight;
   (3) an organohydrogensiloxane in an amount of from 0.1 to 90% by weight;
   (4) a condensation catalyst; and
   (5) a hydrosilylation catalyst.

2. The composition according to claim 1, wherein the (1) dual-end silanol silicone oil is a compound represented by the formula (I):

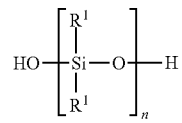

(I)

wherein $R^1$ represents a monovalent hydrocarbon group and n is an integer of 1 or more, provided that all $R^1$ groups may be the same or different.

3. The composition according to claim 1, wherein the (2) alkenyl group-containing dialkoxyalkylsilane is a compound represented by the formula (II):

$$R^2-Si(OR^3)_2R^4 \quad (II)$$

wherein $R^2$ represents a straight-chain or branched alkenyl group, and $R^3$ and $R^4$ each represents a monovalent hydrocarbon group, provided that $R^3$ and $R^4$ may be the same or different and two R groups may be the same or different.

4. The composition according to claim 1, wherein the (3) organohydrogensiloxane is at least one selected from the group consisting of a compound represented by the formula (III):

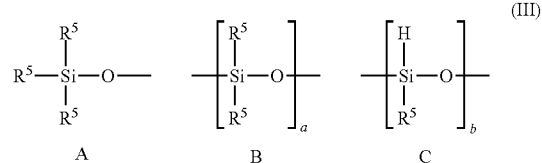

(III)

wherein A, B and C are constitutional units, A represents a terminal unit, B and C each represents a repeating unit, $R^5$ represents a monovalent hydrocarbon group, a represents an integer of 0 or 1 or more, and b represents an integer of 2 or more, provided that all $R^5$ groups may be the same or different,
and a compound represented by the formula (IV):

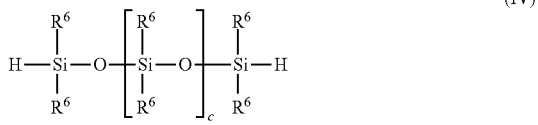

(IV)

wherein $R^6$ represents a monovalent hydrocarbon group and c represents an integer of 0 or 1 or more, provided that all $R^6$ groups may be the same or different.

5. The composition according to claim 1, further comprising (6) an alkenyl group-containing trialkoxysilane.

6. The composition according to claim 5, wherein the (6) alkenyl group-containing trialkoxysilane is a compound represented by the formula (V):

$$R^7-Si(OR^8)_3 \quad (V)$$

wherein $R^7$ represents a straight-chain or branched alkenyl group and $R^8$ represents a monovalent hydrocarbon group, provided that three $R^8$ groups may be the same or different.

7. A silicone resin sheet obtained by semi-curing the composition for a thermosetting silicone resin according to claim 1.

8. An optical semiconductor device comprising an optical semiconductor element which is encapsulated with an encapsulation material containing the composition for thermosetting silicone resin according to claim 1.

* * * * *